(12) United States Patent
Shibata et al.

(10) Patent No.: US 6,635,962 B2
(45) Date of Patent: Oct. 21, 2003

(54) CHIP ON CHIP SEMICONDUCTOR DEVICE

(75) Inventors: Kazutaka Shibata, Kyoto (JP); Shigeyuki Ueda, Kyoto (JP); Toshio Enami, Kyoto (JP)

(73) Assignee: Rohm Co. Ltd., Kyoto (JP)

(*) Notice: Subject to any disclaimer, the term of this patent is extended or adjusted under 35 U.S.C. 154(b) by 0 days.

(21) Appl. No.: 09/950,058

(22) Filed: Sep. 12, 2001

(65) Prior Publication Data

US 2002/0031904 A1 Mar. 14, 2002

(30) Foreign Application Priority Data

Sep. 12, 2000 (JP) .................................. 2000-277345
Jan. 22, 2001 (JP) .................................. 2001-012647

(51) Int. Cl.[7] .............................................. H01L 23/48
(52) U.S. Cl. ........................................ 257/737; 257/777
(58) Field of Search .................................. 257/737, 777

(56) References Cited

U.S. PATENT DOCUMENTS 6,313,529 B1 * 11/2001 Yoshihara et al. .......... 257/724

2002/0017718 A1 * 2/2002 Hikita et al. ................ 257/723

FOREIGN PATENT DOCUMENTS

JP 59-117251 7/1984
JP 9-326465 12/1997

* cited by examiner

*Primary Examiner*—Vu A. Le
*Assistant Examiner*—Christian D. Wilson
(74) *Attorney, Agent, or Firm*—Arent Fox Kintner Plotkin & Kahn, PLLC

(57) ABSTRACT

In the case where a plurality of second semiconductor chips (2a and 2b) are bonded to the surface side of a first semiconductor chip (1) via bump electrodes (11 and 21), an interconnection (9) for directly connecting electrode terminals (22a and 22b) of the two second semiconductor chips (2a and 2b) is formed on the surface of a passivation film (17) of the first semiconductor chip (1). As a result, a semiconductor device of a COC type in which a plurality of second semiconductor chips are mounted, while obtaining generalization of the first semiconductor chip, a signal can be transmitted/received between the second semiconductor chips without changing the design of the semiconductor device in the first semiconductor chip and a method for manufacturing the semiconductor device can be provided.

8 Claims, 6 Drawing Sheets

CHIP ON CHIP SEMICONDUCTOR DEVICE

FIELD OF THE INVENTION

The present invention relates to a semiconductor device of what is called a chip on chip (hereinafter, abbreviated as COC) type semiconductor device, in which a plurality of semiconductor chips are electrically connected so that they face each other and a method for manufacturing the same. More particularly, the invention relates to a semiconductor device using multiple chips, in which a plurality of second semiconductor chips are directly connected on the surface of a first semiconductor chip while an interconnection for connecting the second semiconductor chips can be freely changed without depending on internal design of the first semiconductor chip.

BACKGROUND OF THE INVENTION

Conventionally, in the case of constructing a semiconductor device by combining circuits such as a memory device and its logic circuit, for reduction in an area occupied by forming the circuits three-dimensionally, reduction in parasitic capacity of an RF circuit or the like, generalization of a part of a circuit (for example, a memory device portion is generalized and a driving circuit portion is changed according to an application), and a case where the circuits cannot be formed on one chip due to different fabrication parameters of the circuits, a semiconductor device of the COC type having the structure that a semiconductor circuit is fabricated by a plurality of chips and a semiconductor chip (child chip) is connected onto another semiconductor chip (parent chip) may be used. In recent years, there is a tendency that a multi-chip device in which a plurality of child chips are provided as shown in FIG. 12 is used.

In FIG. 12, electrode terminals 22 of second semiconductor chips (child chips) 2a and 2b are connected onto electrode terminals 12 on a first semiconductor chip (parent chip) 1 via bump electrodes 11 and 21, respectively. The parent chip 1 is bonded to an island (not shown) constructed by a lead frame. Electrode pads (not shown) provided on the peripheral side of the parent chip 1 are electrically connected to leads (not shown) provided around the island via wires such as metal wires, and the periphery is molded by a resin (not shown). Reference numeral 17 denotes a passivation film.

As described above, in the semiconductor device of the COC type, the parent chip 1 and child chips 2a, 2b are connected to each other via the bump electrodes 11 and 21 or the like provided on the electrode terminals. The semiconductor device is connected to external leads via the wires and the electrode pads provided around the parent chip 1. Signals are therefore transmitted between the parent chip 1 and the child chips 2 via bump electrodes. However, in the case where signals are transmitted between the plurality of child chips 2a and 2b, an interconnection is formed in a semiconductor layer or in an insulating film in the surface of the semiconductor layer of the parent chip 1, and end parts of the interconnection are exposed as electrode terminals from the insulating film and connected to the electrode terminals of the child chips.

As described above, in the case of transmitting signals between the parent chip and the child chip in the semiconductor device of the COC type, it is sufficient to connect the electrode pads of the parent chip and the child chip via the bump electrodes. However, in the case where signals are transmitted among a plurality of child chips, signals have to be transmitted via the interconnection formed in the parent chip. Even in the case where the parent chip or the like is generalized and a circuit according to an application is formed by child chips, an interconnection has to be formed in the parent chip in accordance with the child chips to be mounted. There is consequently a problem such that generalization of the parent chip is limited.

Further, in the case where signals have to be transmitted from the outside to one of child chips, signals have to be transmitted to the child chip via the electrode pad and the interconnection in the parent chip. It hinders the generalization of the parent chip.

Further, since the parent chip and child chips are connected via bump electrodes made of Au or the like, if the connecting work is not performed at a high temperature such as 450° C., excellent electric connection cannot be obtained. In this case, however, the semiconductor substrate is also heated to the high temperature and pressure applied on the bump electrodes is also applied on the semiconductor substrate, so that circuit elements cannot be formed under the bump electrodes on both of the chips. It causes a problem that the efficiency of using the semiconductor substrate deteriorates.

SUMMARY OF THE INVENTION

The present invention has been achieved in consideration of such circumstances and an object thereof is to provide a semiconductor device of a COC type in which, while obtaining generalization of a first semiconductor chip, a signal can be transmitted/received between second semiconductor chips formed on the first semiconductor chip without changing design in the first semiconductor chip of the semiconductor device and a method for manufacturing the semiconductor device.

Another object of the present invention is to provide a semiconductor device in which a signal can be transmitted from the outside directly to a child chip connected on a parent chip via an electrode pad of the parent chip while using the generalized parent chip without forming a special interconnection in a semiconductor layer or an insulating layer of the parent chip.

Further another object of the present invention is to provide a semiconductor device having sufficiently increased packing density by making it possible to form circuit elements also in a semiconductor layer under electrode terminals by preventing a high pressure from being applied on a bump electrode at high temperature at the time of connecting a parent chip and a child chip.

Further another object of the present invention is to provide a semiconductor device having improved packing density by making it possible to form a device also under an electrode pad by preventing excessive increase in temperature and application of a pressure with an ultrasonic wave or the like when a wire such as a metal wire for performing wire bonding and an electrode pad are bonded to each other.

According to the present invention, there is provided a semiconductor device in which a plurality of second semiconductor chips are connected to the surface side of a first semiconductor chip via electrode terminals provided on each of the first semiconductor chip and the second semiconductor chip, wherein an interconnection for directly connecting electrode terminals of two second semiconductor chips out of the plurality of second semiconductor chips is formed on the surface of a passivation film of the first semiconductor chip. The semiconductor chip includes not only a semiconductor integrated circuit (IC) but also a discrete part such as a transistor, diode, or capacitor. The substrate is not limited to a silicon substrate or a semiconductor substrate of GaAs or the like, but other substrates on which electronic parts are formed can be also used.

With the structure, since the interconnection is formed on the surface of the passivation film, even when the connection between the second semiconductor chips mounted on the larger first semiconductor chip varies, it is unnecessary to fabricate the semiconductor device by changing the design of the first semiconductor chip. At the time of forming a bump electrode or a metal film which can be bonded to the bump electrode of the second semiconductor chip on the electrode terminal on the surface, the interconnection for connecting necessary electrode terminals can be formed by using the material of the bump electrode or the metal film, and desired connection can be made. Consequently, even in the case of changing the second semiconductor chip or the structure of connection between the second semiconductor chips, a generalized chip as the first semiconductor chip can be used without changing the design of the first semiconductor chip. Thus, very high flexibility is achieved.

Concretely, two electrode terminals are formed on the first semiconductor chip in a portion corresponding to each of the electrode terminals of the two second semiconductor chips directly connected to each other, and an electrode terminal of the first semiconductor chip and an electrode terminal of each of the two second semiconductor chips are electrically connected to each other via at least one bump electrode. In the structure, the interconnection is formed simultaneously with the bump electrodes formed on the two electrode terminals of the first semiconductor chip.

Alternately, the at least one bump electrode may be formed on each of the electrode terminals of the two second semiconductor chips, and the interconnection is formed on the first semiconductor chip between the two electrode terminals by using a material which can be bonded to the at least one bump electrode of the second semiconductor chip.

The material which can be bonded means a material which can be easily bonded to a bump electrode at a low temperature such as the material same as that of the bump electrode of the second semiconductor chip or the material which is easily alloyed with the material of the bump like Cu to soldering. It is preferable that the bump electrode has at least an Au layer since the reliability with respect to temperature, moisture, and the like is high.

According to another aspect of the present invention, there is provided a semiconductor device in which a second semiconductor chip is connected to the surface side of a first semiconductor chip via electrode terminals provided on each of the first semiconductor chip and the second semiconductor chip, having the structure that one electrode terminal is formed on the first semiconductor chip in a portion corresponding to any of electrode terminals of the second semiconductor chips, the one electrode terminal and an electrode pad for connection to an external lead provided on the outside of the first semiconductor chip are connected to each other via an interconnection formed on the surface of a passivation film, and an electric signal can be transmitted directly to the second semiconductor chip via the electrode pad of the first semiconductor chip.

With the structure, it is unnecessary to pre-form a special interconnection in the first semiconductor chip as a parent chip, so that generalized chip can be obtained. A signal can be transmitted to the second semiconductor chip as a child chip from an external lead via the electrode pad of the parent chip (first semiconductor chip).

By connecting the electrode terminal of the first semiconductor chip and that of the second semiconductor chip to each other via an Au—Sn alloy layer, the alloy layer is alloyed and fused at a low temperature of approximately 300° C. or lower. It is unnecessary to increase the temperature to a high temperature at which an influence is exerted on circuit elements. So the circuit elements can be formed also in a semiconductor layer under the electrode terminals. Thus, the circuit elements can be formed with very high density.

According to further another aspect of the present invention, there is provided a semiconductor device including: a semiconductor substrate in which a circuit element is formed; an electrode pad for wire bonding provided either on the surface of the semiconductor substrate via an insulating film or in contact with the semiconductor substrate; and a wire to be bonded to the electrode pad so as to be connected to an external lead, wherein an Au layer and an Sn layer or an Au—Sn layer are provided on the surface of the electrode pad, and the wire and the electrode pad are connected to each other via an Au—Sn alloy layer.

With the structure, at the time of performing wire bonding, it is unnecessary to rub the bonding pad portion with an ultrasonic wave, and the connecting work can be made while hardly applying a pressure. Consequently, even when a device such as a transistor is formed in a semiconductor layer under an electrode pad to which a wire is bonded, a problem such that the device is damaged during bonding does not occur. As a result, a number of devices can be formed in a single semiconductor chip, and the packing density can be improved.

According to further another aspect of the present invention, there is provided a semiconductor device including: a first semiconductor chip having a first bump electrode; a second semiconductor chip including a second bump electrode having a top surface area smaller than that of the first bump electrode; and an Au—Sn alloy layer for bonding the second bump electrode onto the first bump electrode, wherein a step by which at least a part of the peripheral portion of the first bump electrode becomes lower than a center portion side is formed, and wherein a fillet of the Au—Sn alloy layer is formed so as to extend from a top face on the center portion side of the first bump electrode to the periphery of the second bump electrode.

According to the present invention, there is also provided a method for manufacturing a semiconductor device in which each of one or a plurality of second semiconductor chips is connected to the surface side of a first semiconductor chip via electrode terminals, comprising the steps of: forming two electrode terminals or one electrode terminal in a portion of the first semiconductor chip in correspondence with the electrode terminals of two second semiconductor chips out of the plurality of second semiconductor chips or the electrode terminal of the second semiconductor chip to be connected to an electrode pad for connection to an external lead provided on the first semiconductor chip; forming a bump electrode on each of the one or two electrode terminals of the first semiconductor chip and simultaneously forming an interconnection for electrically connecting between the two electrode terminals or between the one electrode terminal and the electrode pad; and connecting the first and second semiconductor chips via the bump electrode, thereby electrically connecting the electrode terminals of the two second semiconductor chips or the electrode terminal of the second semiconductor chip and the electrode pad via the interconnection.

The bump electrode and the interconnection can be formed by, for example, forming a barrier layer in a desired pattern by a film forming method such as sputtering, vacuum deposition, laser abrasion, or CVD, and after that, by performing electrolytic plating or the like.

Alternately, in place of forming the bump electrode on each of the one or two electrode terminals of the first semiconductor chip, forming a bump electrode which is formed on each of the electrode terminals of the one or two second semiconductor chips, and forming an interconnection for connecting between the two electrode terminals or between the one electrode and the electrode pad of the first semiconductor chip by using a material which can be bonded to the bump electrode. In this case, by continuously forming the barrier layer and a film made of the material which can be bonded to the bump electrode, a desired pattern can be formed.

DETAILED DESCRIPTION

Figure 1:
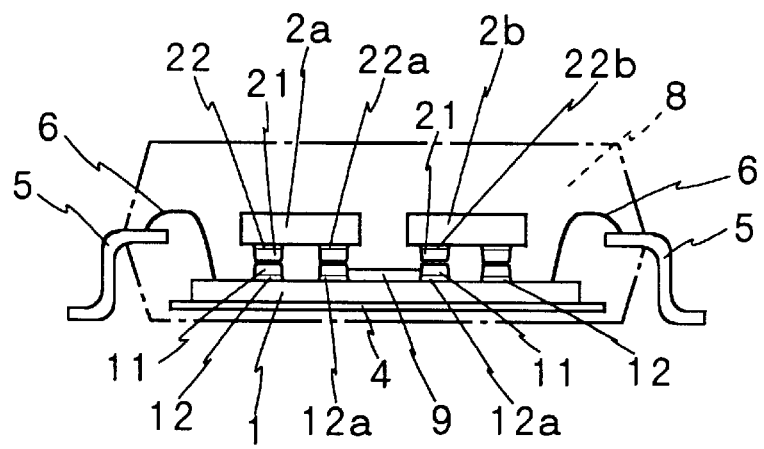
FIGS. 1(a) and 1(b) are cross sections showing an embodiment of a semiconductor device according to the present invention and FIG. 1(c) is an enlarged view of an interconnection.
Figure 1:
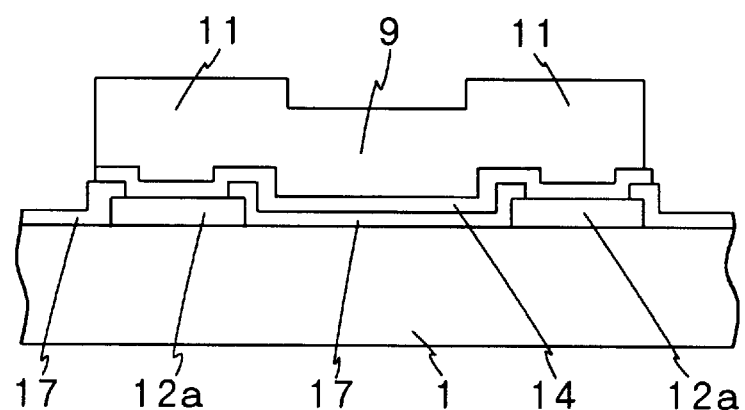
Figure 1:
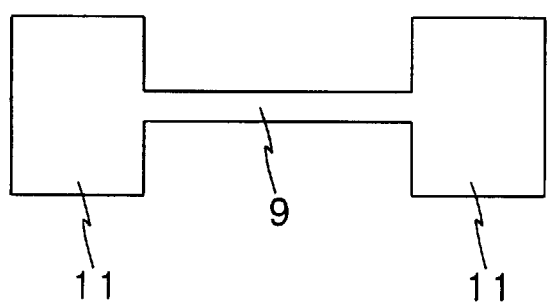

A semiconductor device of the present invention and a method for manufacturing the same will now be described with reference to the drawings. As a semiconductor device according to an embodiment of the present invention is shown in FIGS. 1(a) and 1(b) which are cross sections of a structure and FIG. 1(c) which is a plan view of an interconnection portion, when a plurality of second semiconductor chips 2a and 2b are bonded onto the surface of a first semiconductor chip 1 via bump electrodes 11 and 21, an interconnection 9 for directly connecting electrode terminals 22a and 22b of the two second semiconductor chips 2a and 2b out of a plurality of second semiconductor chips is formed on the surface of a passivation film 17 of the first semiconductor chip 1.

In the example shown in FIGS. 1(a) to 1(c), as an enlarged view of the interconnection portion is shown in FIG. 1(b), each of the bump electrodes 11 and 21 of the first and second semiconductor chips 2a and 2b is formed in thickness of approximately 5 to 30 μm. Simultaneously with formation of the bump electrode 11 of the first semiconductor chip 1, the interconnection 9 is formed between electrode terminals 12a corresponding to the electrode terminals 22a and 22b which have to be directly connected to each other between the second semiconductor chips 2a and 2b.

The bump electrodes 11 and 21 themselves are formed in a conventional manner by, for example, as shown in FIG. 1(b), forming a barrier metal layer 14 on the electrode terminals 12 made of Al or the like so as to have a two- or three-layer structure by sputtering, vacuum deposition, or the like and patterning the barrier metal layer 14. A first layer of the barrier metal layer 14 is made of Ti or Cr, a second layer is made of W, Pt, Ag, Cu, Ni, or the like, and a third layer is made of Au or the like. The barrier metal layer 14 is formed in a thickness of approximately 0.2 to 2 μm in total. The bump electrode 11 is formed in the above-described thickness on the barrier metal layer 14 by a method of electrolytic plating of a metal such as Au, Cu, or the like.

The bump electrode 21 in the second semiconductor chip 2 is similarly formed. Although FIG. 1(a) shows that the electrode terminals are provided directly on the semiconductor layer, there is also a case such that the electrode terminals are connected to either the semiconductor layer or the interconnection in an insulating interlayer.

At the time of forming the bump electrodes 11, by providing the barrier metal layer 14 and a bump electrode material so that the electrode terminals 12a of the first semiconductor chip 1 corresponding to the electrode terminals 22a and 22b which have to be connected directly between the second semiconductor chips 2a and 2b, the interconnection 9 is formed. At the time of patterning the barrier metal layer 14, therefore, only by performing the patterning so as to form the interconnection, the interconnection 9 can be formed only by a work of the conventional process of forming the bump electrode 11. The interconnection 9 does not have to be formed wide like the bump electrode 11 but may be patterned so as to be narrow as shown in the plan view of FIG. 1(c).

Figure 2:
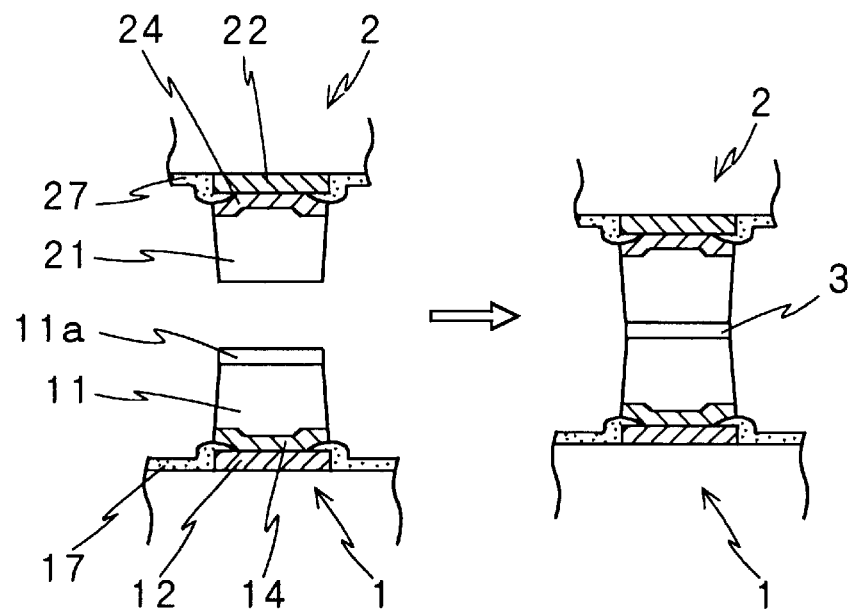
FIG. 2 is an explanatory diagram of a case where a joint portion of a bump electrode is formed by an Au—Sn alloy layer.

In the connecting portion of the bump electrodes 11 and 21, as shown in FIG. 2, an Sn coat 11a is provided on the bump electrode 11 made of Au. The melting point of Au is approximately 1064° C. (since the bumps are made of the same metal, by heating them while applying pressure, the bumps are fused at approximately 450° C.). On the other hand, the melting point of Sn is approximately 232° C. Sn melts at around 230° C. and forms an eutectic crystal (mixed crystal) alloy with Au. At around 280° C., an alloy layer 3 made of an Au—Sn alloy is formed on the joint face of the bump electrodes 11 and 21, and the bump electrodes 11 and 21 are fused together. In other words, the bump electrodes 11 and 21 can be fused together at a low temperature which does not hinder circuit elements and the like formed in the semiconductor substrate.

By using a metal having a high melting point for the bump electrodes 11 and 21, applying a metal coat which is easily alloyed with a metal having a low melting point, and alloying the metal coat, the bump electrodes 11 and 12 can be fused together at a low temperature. Moreover, the bump electrodes 11 and 12 can maintain high strength by the metal having the high melting point. That is, the bump electrodes 11 and 21 can be fused together at a low temperature which does not disturb the temperature of soldering. The Sn coat may not be provided or may be provided on the interconnection 9. It is also possible to provide the Sn coat only on the bump electrode on the second semiconductor chip side. From this point of view, the materials are not limited to Au and Sn.

As shown in FIG. 2, it is preferable to form the Sn coat 11a only on one of the bump electrodes 11 since the alloy layer on the joint face is formed more easily. Specifically, since the contact portion of Au and Sn is alloyed to bond the bump electrodes to each other, when the Sn coat is provided on both of the bumps, the contact portions of the Sn coats are not bonded to each other immediately. The contact portion of the Au layer on the surface of the bump electrode and the Sn coat is alloyed, Au is diffused to the joint portion, and the joint portion is alloyed. Consequently, it is preferable to form the Sn coat so that the Sn coat and the Au layer come into contact with each other. However, by providing a very thin Sn coat on both of the bump electrodes, Au is easily diffused. The very thin Sn coat may be therefore formed on both of the bump electrodes. When the sizes of the bump electrodes to be joined are different from each other, in the case where the bump electrodes may be separated from each other later, it is convenient to provide the Sn coat on the smaller bump electrode since the alloyed portion of the joint portion is small.

Figure 3:
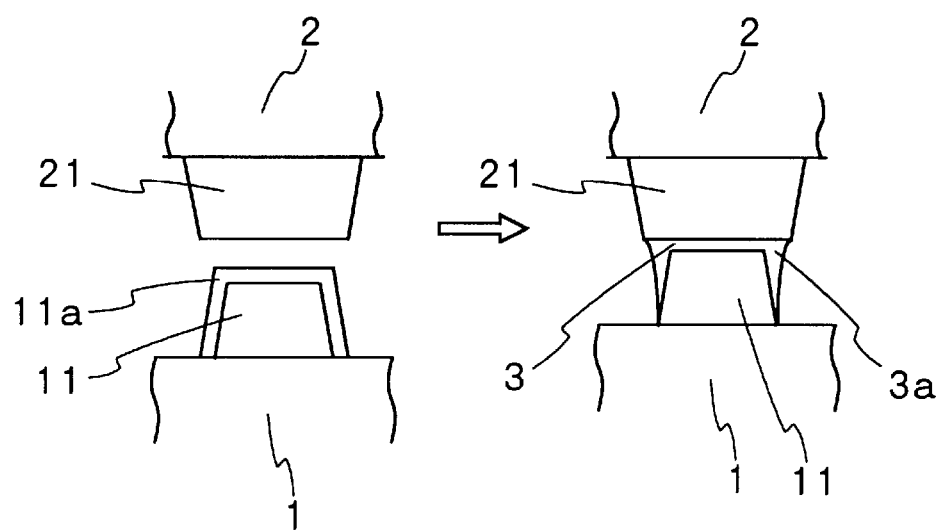
FIG. 3 is an explanatory diagram showing the case where an Sn coat is provided on the entire face of one of the bump electrodes in FIG. 1(a).

On the other hand, when there is no possibility that the joined two semiconductor chips are detached from each other, to connect the semiconductor chips securely, as shown in FIG. 3, the Sn coat 11a is formed not only on the top face of the bump electrode 11 but on the entire bump electrode 11 and alloyed. In such a manner, the alloy layer 3 forms a fillet 3a so as to cover the small bump electrode 11 and the larger bump electrode 21, and the bump electrodes 11 and 21 can be securely joined to each other. In FIG. 3, the electrode pad and the like are not shown and the same components as those in FIG. 2 are designated by the same reference numerals. Also in the case of proving the Sn coat only on the top face of the bump electrode, if the sizes of the bump electrodes are different, by forming the Sn coat on the larger bump electrode, the adhesive strength can be increased.

Figure 4:
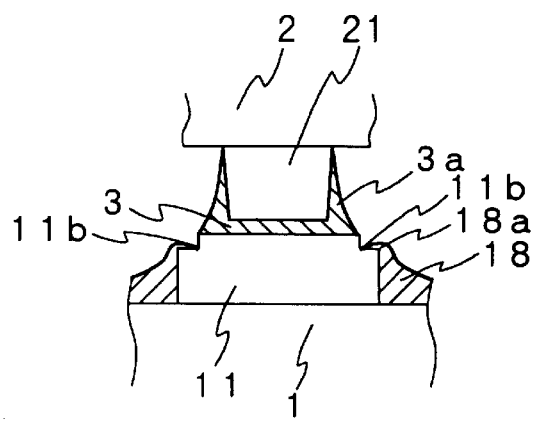
FIGS. 4(a) and 4(b) are diagrams showing an example of the shape of a bump electrode in another embodiment of a semiconductor device according to the present invention and its problem.
Figure 4:
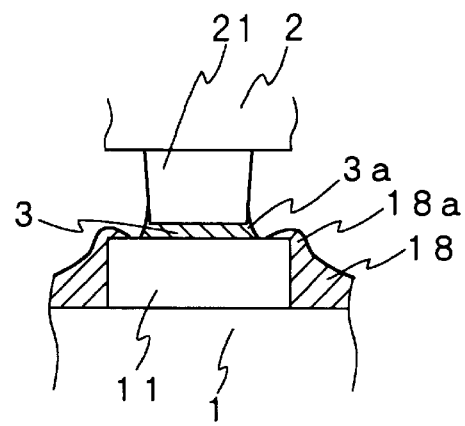

In this case, for example as shown in FIG. 4(b), there is a case that a protection film 18 made of polyimide or the like is formed to the sides of the bump electrode 11 of the first semiconductor chip 1 for the purpose of the interception of α ray or the like. At the time of applying polyimide or the like, there is a fear that an insulating film made of polyimide or the like rises to the surface of the bump electrode 11 due to the surface tension and is adhered to the top surface of the bump electrode 11. When the insulating film is adhered also on the top surface of the bump electrode 11, as shown in FIG. 4(b), the solder fillet 3a becomes smaller. In an extreme case, the reliability of bonding of the bump electrodes 11 and 21 deteriorates.

To solve such a problem, as shown in FIG. 4(a), by forming a step 11b at an end of the larger bump electrode 11, even if the polyimide resin rises onto the bump electrode 11, it is stopped by the step 11b and does not go up to the joint portion (top surface) of the bump electrode 11. Thus, improved bonding strength is achieved. The step 11b is not necessarily formed around the entire bump electrode 11.

When the step 11b is formed partly around the bump electrode 11 so that the total length is equal to or longer than approximately ⅓ of the whole periphery, the rise to the higher portion can be prevented. The step can be formed at the time of forming the bump electrodes by plating as described above, a mask is formed partly in a state where the thickness becomes close to the thickness of the bump electrode 11, and plating is further performed, or after forming the bump electrode 11, a part of the periphery of the bump electrode 11 is etched.

By forming the step 11b in the surface of the bump electrode 11, as in the above-described example, not only in the case where one semiconductor chip is connected to a plurality of semiconductor chips but also in the case where semiconductor chips are connected in a one-to-one manner, the problem caused by the rise of the insulating resin can be similarly prevented.

When the above-described alloy layer is made of a perfect eutectic alloy, it has 80 wt % (percentage by weight) of Au and 20 wt % of Sn. However, since the temperature is not increased sufficiently at the time of bonding, the joint portion does not easily become a perfect eutectic alloy. Even if the joint portion does not easily become a perfect eutectic alloy, when 65 wt % of Au or higher is provided, secure joint can be obtained. Also in the case of separating the chips, by heating the alloy layer to approximately 300° C., only the joint portion can be separated. It is preferable that no alloy layer is formed and only the Au layer exists since mechanical strength is high. Since Au diffuses more than Sn more than approximately 10 times, by adjusting, for example, temperature, time, the amount of the Sn layer, and the like at the time of bonding, an alloy layer having Au of 65 wt % or higher can be bonded so that the portion having the Au layer of 100 wt % remains. More preferably, an Au—Sn eutectic alloy layer has a thickness in a range from 0.8 μm to 5 μm which is achieved by setting the thickness of the Sn coat in a range from approximately 0.1 to 4 μm. The Au layer can be left completely by forming an Au layer (bump electrode) thickly.

The first semiconductor chip 1 is formed in such a manner that a logic circuit such as a digital signal processor is formed on a semiconductor substrate, an insulating interlayer, a wiring film, and the like are provided on the surface and, finally, the electrode terminal 12 for connection to the second semiconductor chip 2 such as a memory device and an electrode pad 13 for connection to an external lead are formed by using Al or the like on the surface thereof.

At this time, although it is unnecessary to connect directly to the second semiconductor chip, the electrode terminals 12a are formed also in portions corresponding to the electrode terminals 22a and 22b to be connected between the plurality of second semiconductor chips 2a and 2b. The bump electrodes 11 are formed on the electrode terminals 12 and 12a via the barrier metal layer 14 as described above, and the interconnection 9 for connecting the electrode terminals 12a corresponding to the electrode terminals 22a and 22b connected between the second semiconductor chips 2a and 2b is formed simultaneously with the bump electrode 11 by using the same material.

On the normal electrode terminals 12 to be directly connected to the second semiconductor chips 2a and 2b, no interconnection is formed but only the bump electrodes 11 are formed. The interconnection, electrode terminals, insulating film, and the like to be formed on the circuit device (semiconductor device) and the semiconductor substrate are formed by a process similar to a normal semiconductor device fabricating process. They may be formed on, not necessarily a normal silicon substrate, but a compound semiconductor substrate made of GaAs or the like.

The second semiconductor chips 2 have, for example, memory devices formed in a matrix. Portions to be connected to the first semiconductor chip 1, portions to be connected to other second semiconductor chips, portions to be connected to external leads or the like, and so on are formed as electrode terminals 22 on the surface of the semiconductor substrate. Also on the surface of the electrode terminal 22, in a manner similar to the first semiconductor chip 1, the bump electrode 21 is formed by using Au or the like. The Sn coat may be formed also on the surface of the bump electrode 21.

It is also possible that the Sn coat is not formed on the first semiconductor chip 1 but is formed only on the bump electrode 21 of the second semiconductor chip 2. The second semiconductor chip 2 is not necessarily such an IC but may be a discrete part such as a transistor, diode, or capacitor which is not formed on the semiconductor substrate. Particularly, in the case of forming a static-shielding composite semiconductor device, it is preferable to mount a discrete protection diode or the like as the second semiconductor chip since a protection device of a large capacity can be built in.

The bump electrodes 11 and 21 of the first and second semiconductor chips 1 and 2 can be fused together by, for example, placing the first semiconductor chip 1 on a substrate stage which can heat the first semiconductor chip 1, positioning the second semiconductor chip 2 so that their bumps are adjusted to the bumps of the first semiconductor chip 1 by a mounter, and heating the first and second semiconductor chips 1 and 2 to approximately 300° C. while applying pressure.

The gap between the first and second semiconductor chips 1 and 2 is filled with, as will be described hereinafter, an insulating resin such as epoxy resin, epoxy phenol resin, or elastomer. The joined semiconductor chips 1, 2a, and 2b are bonded on a die island 4 made by a lead frame in a manner similar to fabricate of a normal semiconductor device, bonded to a lead 5 via wires 6 such as metal wires, and a resin package 8 is formed by molding. After the leads 5 are cut from the lead frame, the semiconductor device is formed in a shape as shown in FIG. 1(a).

In the example shown in FIG. 1(a), only connection portions of the electrode terminals of the second semiconductor chips 2a and 2b are shown. As shown in the plan view of the first semiconductor chip 1 of FIG. 5, an interconnection 9c directly connected from an electrode pad 13a of the first semiconductor chip 1 to the second semiconductor chip 2b or 2c can be formed from not via the internal interconnection of the first semiconductor chip 1. This point will be described in detail by referring to FIG. 10.

Figure 5:
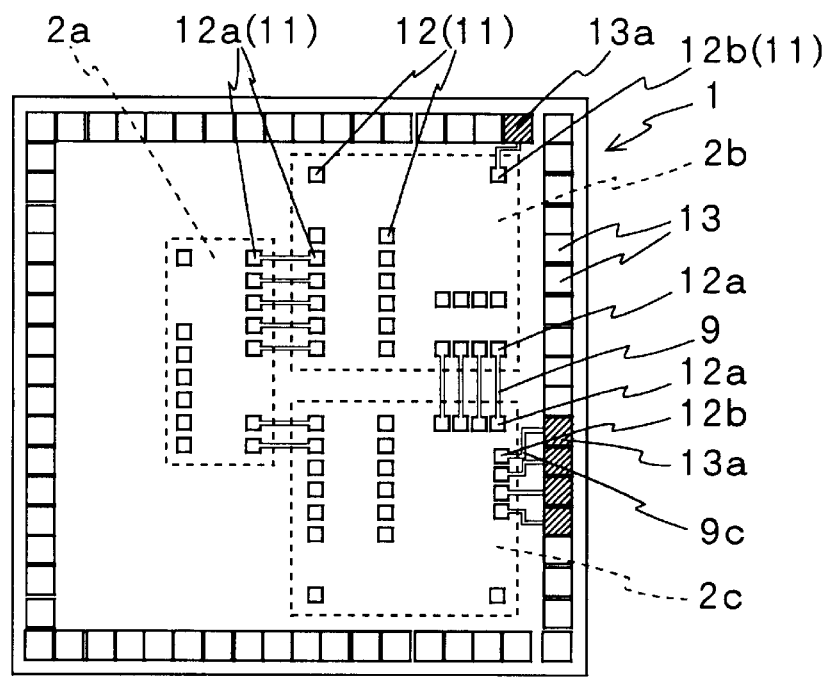
FIG. 5 is a plan view of a first semiconductor chip of the semiconductor device according to the present invention.

Specifically, in the example shown in FIG. 5, for example, a structure in which three semiconductor chips 2a to 2c are mounted is employed. A plurality of sets of connections of electrode terminals are formed between the second semiconductor chips 2a, 2b, and 2c and between the second semiconductor chips 2b and 2c and the electrode pads 13a. In such a case as well, the interconnections 9 and 9c for connecting the electrode terminals 12a of the first semiconductor chip 1 corresponding to the electrode terminals of the second semiconductor chips 2a and 2b and the electrode terminals of the second semiconductor chips 2b and 2c, and for connecting the electrode terminals 12a and the electrode pads 13a are formed simultaneously with the bump electrodes 11. In FIG. 5, the reference numerals of the electrode terminals 12, 12a, and 12b on the lower side of the bump electrodes 11 are also shown. In FIG. 5, reference numeral 13 denotes an electrode pad for connection to a normal external lead.

The semiconductor device according to the present invention is of the COC type in which a plurality of second semiconductor chips are connected onto a first semiconductor chip. Electrode terminals for connecting the second semiconductor chips are formed in portions of the first semiconductor chip corresponding to the electrode terminals. At the time of forming bumps on the electrode terminals, or at the time of forming a metal film which can be bonded to bumps, interconnections for connecting the electrode terminals are simultaneously formed of the same material as that of the bumps or metal film, and the first and second semiconductor chips are bonded via the bump electrodes, thereby connecting the second semiconductor chips. Consequently, even when the connecting relation between the second semiconductor chips is changed by varying the design of the second semiconductor chips, it is unnecessary to change the wiring design or the like of the first semiconductor chip. Only by changing the patterning at the time of forming bumps, desired connection can be carried out.

Specifically, in the method of forming the interconnection in the semiconductor layer or the insulating film on the surface of the semiconductor layer, it is necessary to modify the design of the first semiconductor device, and the design of the first semiconductor chip has to be changed. However, according to the invention, since the interconnection for connection is formed on the surface of the passivation film, it is sufficient to form an interconnection in a desired pattern at the time of providing bump electrodes or a metal film which can be bonded to bump electrodes, and it is unnecessary to change the design and specification of the first semiconductor chip.

In the above example, the bump electrodes 11 and 21 are formed on both of the electrode terminals of first semiconductor chip 1 and second semiconductor chips 2 (2a and 2b). It is also possible to form a bump electrode on only one of the electrode terminals as long as it is in the connection portion. The interconnection 9 does not have to be formed in the same thickness as that of the bump electrode 11 as in the above description but may have a thickness of a few micro meters or less like a normal interconnection. From this viewpoint, for example, as shown in FIG. 6, it is also possible to form the bump electrodes only on the second semiconductor chips 2 (2a and 2b), form the barrier layer 14 and the Au film 15 of the same material as that of the bump electrode of the second semiconductor chip 2, and form the interconnection 9 also by the barrier layer 14 and the Au film 15.

Figure 6:
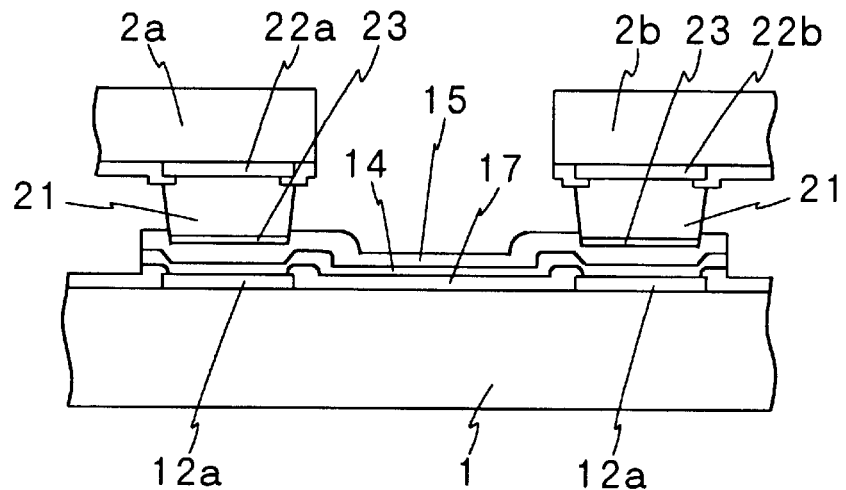
FIG. 6 is an enlarged view of an interconnection in another embodiment of the semiconductor device according to the present invention.

Specifically, in FIG. 6, the metal film (Au film) 15 made of, for example, Au and having a thickness of approximately 0.2 to 0.7 $\mu$m is provided on and between the electrode terminals 12a on the first semiconductor chip 1 corresponding to the electrode terminals 22a and 22b for directly connecting the second semiconductor chips 2a and 2b via the barrier metal layer 14 (the barrier layer 14 is provided in a manner similar to the above-described example). On the second semiconductor chip 2, in a manner similar to the above, the bump electrodes 21 made of Au and an Sn coat 23 are formed. The bump electrode 21 and the Au film 15 on the electrode terminal 12a are fused together. In the example, the Sn coat 23 is formed on the bump electrode 21.

By forming the Sn coat on the bump electrode 21 or the Au film 15 in such a manner, the temperature of the fusion with the bump can be decreased. On the electrode terminal 12 (not shown) connected between the first and second semiconductor chips 1 and 2, similarly, the barrier layer 14 and the Au film 15 are formed, and the electrode terminal 12 is also fused together with the bump electrode 21 provided on the second semiconductor chip 2 side via an Sn coat or the like.

Figure 7:
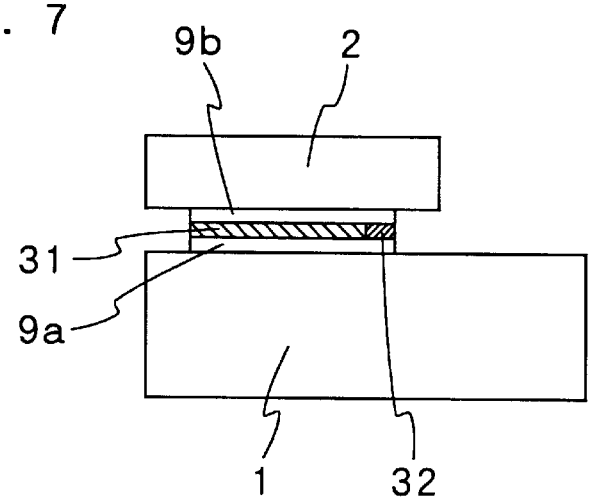
FIG. 7 is a diagram for describing an example where first and second semiconductor chips are bonded to each other without forming a bump.

In the example shown in FIG. 7, bump electrodes are not provided for both of the semiconductor chips, and the interconnections are connected each other. Specifically, the Sn coat is formed on the surface of a part of one of an interconnection 9a of the first semiconductor chip 1 and an interconnection 9b of the second semiconductor chip 2, and an insulating film 31 made of, for example, polyimide, $SiO_2$, or the like is provided on the other portion, thereby forming a joint portion 32 only in the portion where the Sn coat is provided. The semiconductor chips can be connected via the joint portion 32. In this structure, since the Au layer in the interconnection is not thick but thin unlike the bump, there is a high possibility that a portion of only the Au layer, in which Sn is not diffused after bonding is not formed. However, it is unnecessary to form the bump electrodes, so that the number of processes can be reduced. Since semiconductor chips are bonded via the insulating layer, it eliminates a problem such that a force is applied only to the joint portion.

Figure 8:
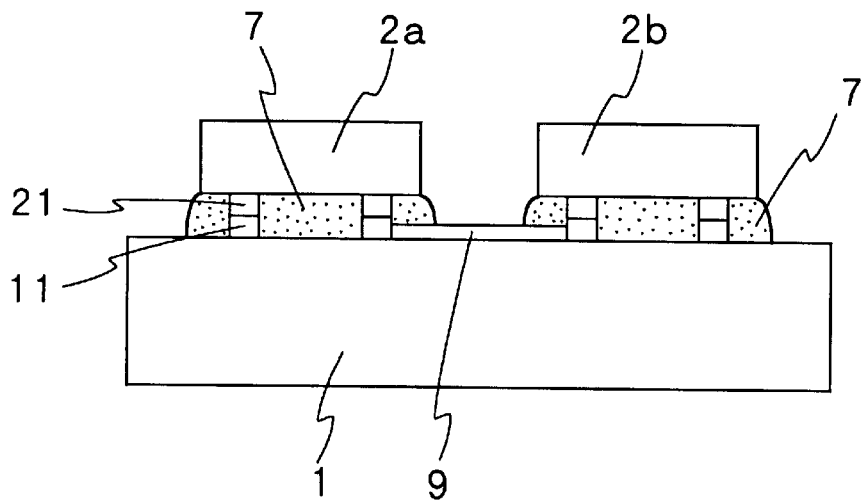
FIG. 8 is a diagram for describing an example where a gap between the first and second semiconductor chips is filled with an insulating resin.

Preferably, the gap between the first and second semiconductor chips 1 and 2 is filled with an insulating resin as described above. To be specific, as shown in FIG. 8, the first and second semiconductor chips 1 and 2 are bonded to each other and, after that, the insulating resin such as polyimide is dropped to the gap between them and hardened, thereby forming an underfill (insulating resin layer) 7. By forming such an underfill 7, the chips are in contact with each other on their faces. Consequently, a problem such that a device formed in a semiconductor layer under the bump electrode is damaged does not occur. Specifically, when the semiconductor chip is packaged by a mold resin, the mold resin does not easily enter the gap between the semiconductor chips. Consequently, when there is a gap, both of the semiconductor chips are pressed against each other by the resin package 8, the pressure has to be absorbed only by the bump electrode portion, and it causes a problem as described above. By providing the underfill 7, such a problem is not caused.

In this case, it is preferable to use polyimide (having an elastic modulus of 4.5 GPa) since the elastic modulus is similar to that of Au. When the elastic modulus of the underfill 7 is similar to that of the bump electrodes 11 and 21, even in the case where the bump electrodes are fused and, after that, the temperature decreases, the compressive force applied on the bump electrode and that applied on the other portion of the semiconductor chip become equal to each other. Consequently, the force is dispersed and the second semiconductor chip 2 can be supported by a face including the bump electrodes, and a force is not applied only to the bump electrode portion.

Further, it is preferable to use a resin having the coefficient of heat contraction (coefficient of thermal expansion) of 4% or lower as the underfill 7. If the coefficient of heat contraction is high, when the temperature increased to approximately 300° C. decreases to a room temperature at the time of hardening, the coefficient of heat contraction of the resin becomes higher than that of Au of the bump electrode, and a compression force acts only to the bump electrode portion, thereby damaging the semiconductor layer under the bump electrode portion.

Figure 9:
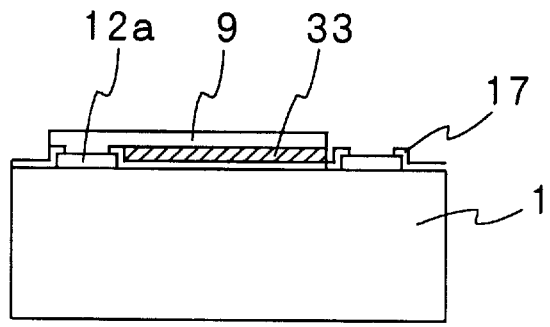
FIG. 9 is a diagram describing a modification of the embodiment shown in FIG. 1.

In the example shown in FIG. 1, there is a step between the surface of the electrode pad 12a and that of the insulating film 17, and the interconnection 9 provided thereon is not accordingly flat. There is a problem such that the bonding is not easily carried out. In order to solve the problem, as shown in FIG. 9, an insulating film 33 made of polyimide or the like is formed on the insulating film 17 and, after that, the interconnection 9 is formed, thereby forming the flat interconnection 9. There is an advantage that the bonding is easily carried out.

In each of the examples, the second semiconductor chips as child chips are connected via the interconnection. There is also a case that a signal is transmitted directly from the outside to the second semiconductor chip. In such a case, conventionally, an interconnection is formed in the insulating film or semiconductor layer in the first semiconductor chip as the parent chip, and the electrode terminal of the second semiconductor chip has to be connected to an electrode terminal at the end of the interconnection. An embodiment for solving such a problem is shown in FIG. 10.

Specifically, although the first and second semiconductor chips 1 and 2 are connected to each other in a manner similar to the example shown in FIG. 1, the interconnection 9c similar to the interconnection 9 shown in FIG. 1 is formed on the surface of the insulating film 17 so as to be connected to the electrode pad 13a for external connection of the first semiconductor chip 1, and the second semiconductor chip 2c is connected to the interconnection 9c, thereby enabling a signal to be directly transmitted from an external lead connected to the electrode pad 13a to the second semiconductor chip 2c. Reference numeral 6 denotes a wire to be connected to the external lead. The interconnection 9c and the electrode pad 13a correspond to those of the same reference numerals in the plan view of FIG. 5.

Figure 10:
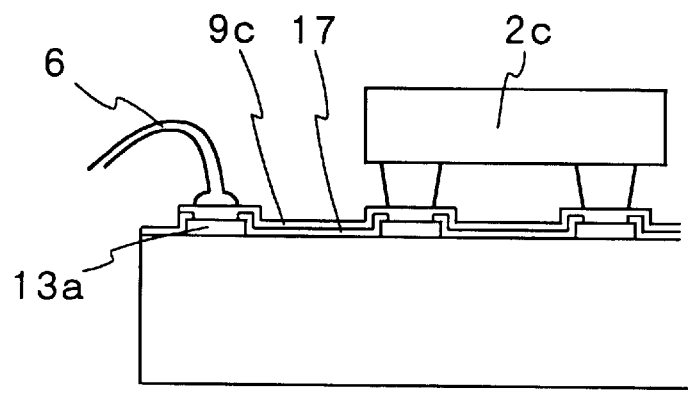
FIG. 10 is a diagram for describing another embodiment of the semiconductor device according to the present invention.

By forming the interconnection 9c continuously and forming an Au layer and an Sn coat or an Au—Sn coat also for the electrode pad 13a to which the wire 6 is bonded as shown in FIG. 10, the wire can be easily bonded without rubbing the surface with an ultrasonic wave or the like.

With the structure, without changing the design of the first semiconductor chip as a parent chip, by changing the second semiconductor chip as a child chip, even in the case where a signal has to be transmitted from the outside directly to the second semiconductor chip, by forming the interconnection on the surface of the first semiconductor chip, a signal can be directly transmitted. The interconnection 9c can be formed simultaneously with the formation of bumps in a manner similar to the interconnection 9 shown in FIG. 1.

Figure 11:
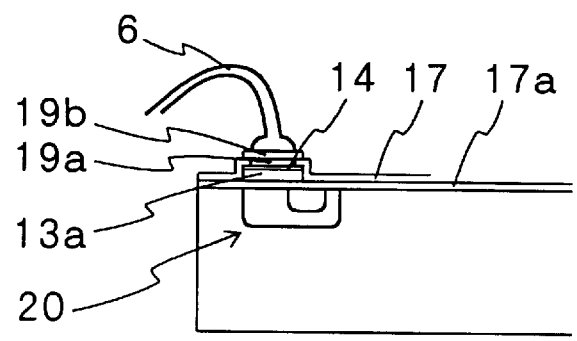
FIG. 11 is a diagram for describing an example where an Au layer and an Sn layer are formed for an electrode pad for wire bonding, and a wire is bonded.
Figure 12:
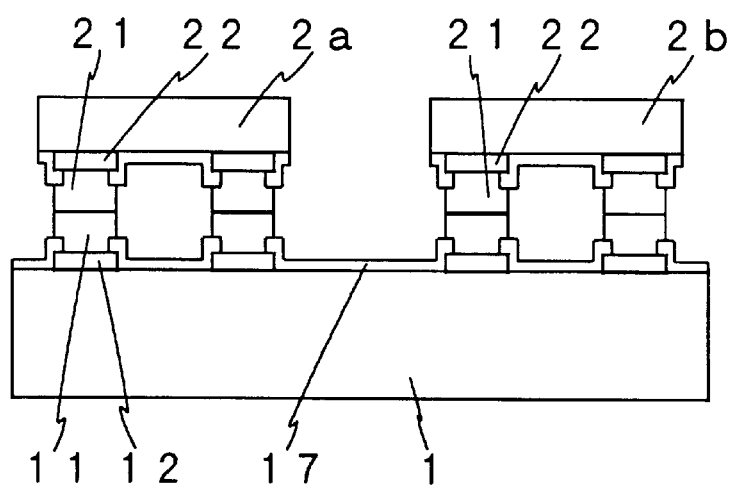
FIG. 12 is a diagram for describing a joint portion of chips in an example where two chips are mounted on a chip in a conventional COC type semiconductor device.

The method of providing the Au layer and the Sn or Au—Sn coat on the surface of the electrode pad 13a for external connection to which a wire is bonded can be applied not only to a semiconductor device of the COC type and a semiconductor device in which an interconnection is formed on the surface of an insulating film but also to a normal semiconductor device. As shown in FIG. 11, not necessarily in the COC type, but a semiconductor device has an electrode pad to which an external lead is to be connected via an Au line or the like. Consequently, in the case of bonding a wire, a wire is heated and bonded while performing rubbing with an ultrasonic wave. Due to this, a pressure is applied also to the semiconductor layer. A device such as a transistor cannot be formed in a semiconductor layer under the electrode pad 13a for external connection, and reduction in the size of the semiconductor chip is limited.

However, by providing an Au layer 19a having a thickness of approximately 0.5 to 1 $\mu$m and an Sn coat 19b having a thickness of approximately 0.2 to 0.4 μm, in a manner similar to the above-described connection of the bump electrode, an Au—Sn alloy layer is formed by heating the layers at 250 to 350° C. and the wire can be easily bonded without performing the rubbing with an ultrasonic wave. In FIG. 11, reference numeral 14 denotes a barrier metal layer made of TiW or the like similar to the above.

With the configuration, even when a circuit element 20 such as a transistor is formed in the semiconductor layer under the electrode pad 13a, it is not broken or characteristics do not fluctuate. As a result, a wire bonding process is facilitated, the reliability of bonding is improved, and circuit elements can be formed also under the electrode pad. Thus, packing density can be improved.

In each of the examples, the barrier layer and the Au film are provided for the electrode terminal of the first semiconductor chip 1. The film to be provided is not limited to the Au film, but any material which can be bonded to a bump to be fused with the bump electrode provided for the second semiconductor chip 2 may be used.

As described above, according to the invention, in the semiconductor device of the COC type in which two or more second semiconductor chips are mounted on the first semiconductor chip, even in the case where a plurality of second semiconductor chips have to be connected to each other, they are connected by forming the interconnection on the surface of the passivation film of the first semiconductor chip. Consequently, even when the specifications of the interconnection of the second semiconductor chips are varied by changing the second semiconductor chip, without changing the internal design of the first semiconductor chip and the like, assembly can be made easily. As a result, improved generalization of the first semiconductor chip is achieved, and the first semiconductor chip can be used for semiconductor devices of various types.

Also in the case of transmitting a signal from the outside directly to the second semiconductor chip by forming an interconnection on the surface of an insulating film not only between second semiconductor chips but also between electrode terminals for connecting an electrode pad for connection to an external lead and the electrode terminal for connecting the second semiconductor chip, without forming the first semiconductor chip dedicated to the transmission, a signal can be easily transmitted from the outside.

Further, by providing the Au layer and Sn layer, or the Au—Sn alloy layer for the connection portion, an Au—Sn eutectic crystal alloy layer is formed at low temperature. Consequently, it becomes unnecessary to apply an ultrasonic wave or the like or to set a high temperature at the time of connection. The circuit element(s) can be therefore formed in a semiconductor layer under an electrode pad. Thus, improved packing density can be achieved.

By providing the Au layer and Sn layer or the Au—Sn alloy layer also for an electrode pad for wire bonding, a wire can be easily bonded without applying a pressure with an ultrasonic wave or the like at the time of wire bonding. As a result, a device can be formed also under the electrode pad, and improved packing density of a semiconductor device can be achieved.

Although preferred examples have been described in some detail it is to be understood that certain changes can be made by those skilled in the art without departing from the spirit and scope of the invention as defined by the appended claims.

What is claimed is:

1. A semiconductor device comprising:

a first semiconductor chip; and a plurality of second semiconductor chips, each of said plurality of second semiconductor chips being connected to the surface side of said first semiconductor chip via electrode terminals provided on each of said first semiconductor chip and said second semiconductor chips, wherein an interconnection for directly connecting electrode terminals of two second semiconductor chips out of said plurality of second semiconductor chips is formed on the surface of a passivation film of said first semiconductor chip.

2. The semiconductor device of claim 1, wherein two electrode terminals are formed on said first semiconductor chip in a portion corresponding to each of the electrode terminals of said two second semiconductor chips directly connected to each other, wherein an electrode terminal of said first semiconductor chip and an electrode terminal of each of said two second semiconductor chips are electrically connected to each other via at least one bump, and wherein said interconnection is formed simultaneously with bumps formed on said two electrode terminals of said first semiconductor chip.

3. The semiconductor device of claim 1, wherein two electrode terminals are formed on said first semiconductor chip in a portion corresponding to each of the electrode terminals of said two second semiconductor chips directly connected to each other, wherein an electrode terminal of said first semiconductor chip and an electrode terminal of each of said two second semiconductor chips are electrically connected to each other via at least one bump, and wherein said at least one bump is formed on each of the electrode terminals of said two second semiconductor chips, and said interconnection is formed on said first semiconductor chip between said two electrode terminals by using a material which can be bonded to said at least one bump of said second semiconductor chip.

4. The semiconductor device of claim 2 or 3, wherein said at least one bump has at least an Au layer.

5. A semiconductor device comprising:

a first semiconductor chip; and a second semiconductor chip which is connected to the surface side of said first semiconductor chip via electrode terminals provided on each of said first semiconductor chip and said second semiconductor chip, wherein one electrode terminal is formed on said first semiconductor chip in a portion corresponding to any of electrode terminals of said second semiconductor chip, wherein said one electrode terminal and an electrode pad for connection to an external lead provided on the outside of said first semiconductor chip are connected to each other via an interconnection formed on the surface of a passivation film, and wherein an electric signal can be transmitted directly to said second semiconductor chip via said electrode pad of said first semiconductor chip.

6. The semiconductor device of claim 1 or 5, wherein said electrode terminals of said first semiconductor chip and said second semiconductor chip are connected to each other via an Au—Sn alloy layer.

7. A semiconductor device comprising:
- a semiconductor substrate in which a circuit element is formed;
- an electrode pad for wire bonding provided either on the surface of the semiconductor substrate via an insulating film or in contact with the semiconductor substrate; and
- a wire to be bonded to said electrode pad so as to be connected to an external lead,
- wherein an Au layer and an Sn layer or an Au—Sn layer are provided on the surface of said electrode pad, and said wire and said electrode pad are connected to each other via an Au—Sn alloy layer.

8. A semiconductor device comprising;
- a first semiconductor chip having a first bump;
- a second semiconductor chip having a second bump having a top surface area smaller than that of said first bump, and
- an Au—Sn alloy layer for bonding said second bump onto said first bump,
- wherein a step by which at least a part of the peripheral portion of said first bump becomes lower than a center portion is formed, and
- wherein a fillet of said Au—Sn alloy layer is formed so as to extend from a top surface on the center portion side of said first bump to the periphery of said second bump.

* * * * *